United States Patent [19]
Bair et al.

[11] Patent Number: 6,065,134
[45] Date of Patent: *May 16, 2000

[54] METHOD FOR REPAIRING AN ASIC MEMORY WITH REDUNDANCY ROW AND INPUT/OUTPUT LINES

[75] Inventors: Owen S. Bair, Saratoga; Saravana Soundararajan, Sunnyvale; Adam Kablanian, San Jose; Thomas P. Anderson, Sunnyvale; Chuong T. Le, San Jose, all of Calif.

[73] Assignee: LSI Logic Corporation, Milpitas, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/052,043

[22] Filed: Mar. 30, 1998

Related U.S. Application Data

[63] Continuation of application No. 08/598,155, Feb. 7, 1996, abandoned.

[51] Int. Cl.[7] .............................. G06F 11/16; G06F 12/00
[52] U.S. Cl. .................................. 714/7; 714/6; 714/710; 714/711
[58] Field of Search ..................................... 395/180, 181, 395/182.01, 182.03, 182.04, 182.05; 365/200, 201; 371/21.1, 10.2, 10.3; 714/1, 2, 3, 5, 6, 7, 718, 710, 711

[56] References Cited

U.S. PATENT DOCUMENTS

| | | |
|---|---|---|
| 4,757,503 | 7/1988 | Hayes et al. .......................... 371/21.1 |
| 5,153,880 | 10/1992 | Owen et al. ............................ 371/10.2 |
| 5,243,570 | 9/1993 | Sarawatari ............................... 365/201 |
| 5,267,205 | 11/1993 | Hamada ................................... 365/200 |
| 5,267,242 | 11/1993 | Lavallee et al. ....................... 371/10.2 |
| 5,325,333 | 6/1994 | Sato ........................................ 365/200 |
| 5,337,277 | 8/1994 | Jans ........................................ 365/200 |
| 5,377,146 | 12/1994 | Reddy et al. .......................... 365/200 |
| 5,424,986 | 6/1995 | McClure ................................. 365/200 |
| 5,487,040 | 1/1996 | Sukegawa et al. ..................... 365/200 |
| 5,553,231 | 9/1996 | Papenberf et al. ................. 395/182.03 |
| 5,684,740 | 11/1997 | Hirata ................................. 365/185.09 |
| 5,764,878 | 6/1998 | Kablanian et al. ......................... 714/7 |
| 5,805,789 | 9/1998 | Houtt et al. ................................ 714/7 |

Primary Examiner—Dieu-Minh T. Le

[57] ABSTRACT

A method provides an on-chip repair technique to fix defective row or I/O memory lines in an ASIC memory array with redundancy row or I/O memory lines. The method employs progressive urgency and dynamic repair schemes to optimize the allotted time for repairing defective row and I/O memory lines. Progressive urgency scheme increases the need to repair relative to the available redundancy row or I/O memory lines over the entire repairing time. Dynamic repair executes a mandatory-row or a mandatory-I/O repair as defective row or I/O memory lines are detected. In addition, a recurrence error reroutes the address location of a redundancy memory line to another address location of another redundancy memory line in the event that such redundancy memory line itself is defective, and thus requires further repair.

8 Claims, 7 Drawing Sheets

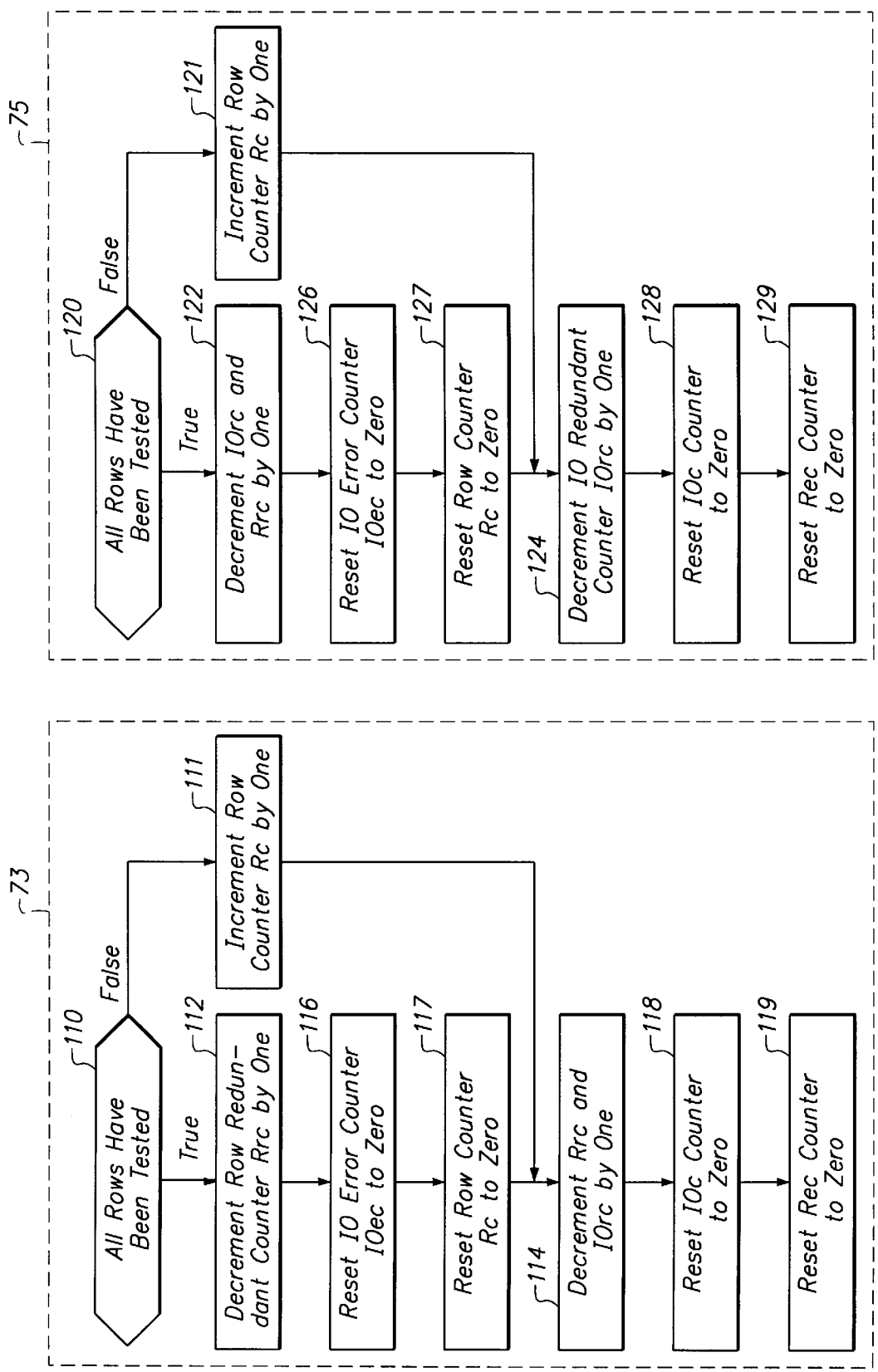

METHOD FOR REPAIRING AN ASIC MEMORY WITH REDUNDANCY ROW AND INPUT/OUTPUT LINES

This application is a continuation of application Ser. No. 08/598,155 filed Feb. 7, 1996, now abandoned.

RELATED APPLICATION

The subject matter of this application is related to the subject matter of co-pending U.S. Application entitled "Built-In Self-Repair System for Embedded Memories", Ser. No. 08/597,964, filed on Feb. 7, 1996, which is incorporated herein by reference.

1. Field of the Invention

The present invention relates to the field of application specific integrated circuit (ASIC) memories, and more particularly, to methods for repairing defective memory lines with redundancy memory lines in an ASIC memory.

2. Background of the Invention

In the semiconductor industry, ASIC memories have gained enormous popularity in integrated circuits (ICs) designs. ASICs allows custom or semicustom design of ICs in shorter turn-around time while reducing the total component count and manufacturing costs. ASICs employ libraries of "standard cells" as building blocks to construct the desired logic circuits. Standard cells include commonly used programmable logic arrays, decoders, registers, counters, and other conventional circuits or components.

An ASIC chip contains single or multiple configurable memory arrays with row memory lines intersecting column memory lines. A plurality of column memory lines can be grouped together to form an I/O (input/output) memory block. In such instance, the memory array contains row memory lines intersecting I/O memory blocks. Each intersecting point between a row memory line and an I/O memory block represents one memory cell which stores a binary digit of logic "0" or "1". The collection of these memory cells forms a memory array which serves as a principle building block for implementing a custom or semicustom ASIC chip.

One pitfall of ASIC designs arises when memory cells fail to retain the correct data caused, for example, by the degradation of the cell structure, external abridging defects, or other reasons. Degradation of a cell structure can occur from extended use of the memory cell. External abridging defects can occur during the semiconductor fabrication process from undesirable particles that settle onto a semiconductor layer. A single memory cell failure can cause the entire ASIC chip to malfunction, and render the chip unusable. The defective ASIC chip that contains a defective memory cell must be repaired or replaced to ensure proper functioning of the ASIC chip.

Another difficulty arises from packing higher-density building blocks into an ASIC chip. Large memory blocks contain a multitude of row memory lines intersecting I/O memory blocks. As a memory array increases in size, the number of correctly functioning memory arrays decreases proportionally, caused by the increasing likelihood of locating memory cell defects within the larger memory array. In order to produce such large ASIC memories while maintaining cost control, some methodology of redundancy is desirable in order to maintain the entire memory array in correctly functioning state.

A conventional solution provides repairing schemes that encompass a number of separately performed processes, each of which requires equipment that is external to the ASIC memory chip. The first of these processes is testing. Automatic Test Equipment (ATE) is used to test at least one memory array on an ASIC chip. A series of test signal patterns is applied through the ATE to detect the locations of memory failures based upon responsive outputs which are then recorded in the ATE. The next process is one of analysis. External software is used to determine optimal utilization of the redundant memory lines to repair the defective memory lines. The third process is the repair process. Fuse and/or antifuse equipment facilitates severing circuit fuses that are formed on the chip for selective removal through conventional laser beam techniques to repair a defective memory cell. The final process involves retesting the chip using the ATE to ensure that the chip functions properly after being repaired. The repaired chip is then packaged and sent to the customer.

Such techniques for repairing ASIC chips commonly burdens a manufacturer to repair defective chips returned from users. In order to repair a defective chip, a manufacturer usually performs two tests in sequence. The first test is performed before repair, and the second test is performed after repair. This process of repairing is time-consuming and costly to a manufacturer. In addition, such repair techniques are performed external to a chip, and the chip may be mis-handled between and during each process, causing additional defects in the chip. Finally, since repairs are performed at a manufacturer's site, parts that become defective after use are generally discarded even if a repair is possible.

Although ASIC vendors strive to produce chips which are not prone to memory defects, as a practical matter, memory defects do occur for various reasons. Such causes can happen during the manufacturing process, such as when random particles of dust settle on the surface of a memory cell during processing. As the density of ASIC memories increases, the likelihood of memory defects also increases at a somewhat linear rate. As a result, defective ASIC chips slow down manufacturing lines and add extra costs of using ASIC chips.

Accordingly, it is desirable to provide a method for implementing on-chip repairing schemes of ASIC chips with redundancy rows and I/O memory lines in an optimized manner.

SUMMARY OF THE INVENTION

The method of the present invention facilitates repairing defective memory lines in an ASIC memory that is fabricated with redundancy rows and I/O memory lines. The method employs progressive urgency and dynamic repair schemes to attain optimal system performance in repairing defective memory lines in a memory array within an ASIC memory. Successful repair of an ASIC chip depends in part upon the number of times that a built-in self test (BIST) pass is executed, and upon the decision of when to perform the repair of rows and I/O memory lines. BIST passes commonly are sufficient to test an entire memory array, and the number of BIST passes is comparable to the number of rows to be tested in the memory array.

A dynamic repair scheme in accordance with the present invention repairs the defective memory lines with redundancy memory lines as soon as it is determined that mandatory repair of a defective memory line is indicated following a BIST pass. Two types of mandatory repairs are performed, a mandatory-row repair to replace a defective row memory line and a mandatory-I/O repair to replace a defective I/O memory line. These two mandatory schemes are applied simultaneously to an ASIC memory for each BIST pass. If the mandatory-row repair is invoked, the address location of the defective row reroutes to a new address location associated with a redundancy row memory line. Similarly, if the mandatory-I/O repair applies, the address location of the defective I/O reroutes to a new address location associated with a redundancy I/O memory line. In situations where both repairs are required, the method includes a specific dominant fault mechanism that prefers one mandatory repair over another mandatory repair. For example, the mandatory-row repair may be designated as the dominant fault mechanism over the mandatory-I/O repair. Hence, the defective row or I/O memory lines are dynamically repaired as defects in each row or I/O memory line are detected.

A progressive urgency scheme ensures that the execution time to perform BIST is not excessive. This is achieved by increasing the urgency to perform mandatory-row or mandatory-I/O repair at the end of each BIST pass. The threshold value of a mandatory-row repair drops incrementally with each BIST pass by decrementing the redundant rowcounter by one. The redundant rowcounter is used for decision making purposes and does not necessarily reflect the actual number of available redundant row memory lines. Similarly, the threshold value of a mandatory-I/O repair decreases incrementally with each BIST pass by decrementing the redundant I/O counter by one. The redundant I/O counter serves as a variable to determine whether mandatory-I/O repair is required and does not necessarily reflect the actual number of available redundant I/O memory lines. In one embodiment, the following arithmetic ratio is used to determine the number of BISR pass: Rrc/5, round the value up to the next whole number. For example, if a memory array contains 8 redundant row memory lines, the method would run two BIST passes through the memory array.

BRIEF DESCRIPTION OF THE DRAWINGS

FIG. 8 is a flowgraph of the process of updating various counters after a mandatory-row repair.

FIG. 9 is a flowgraph of the process of updating various counters after a mandatory-I/O repair.

DETAILED DESCRIPTION OF THE PREFERRED EMBODIMENT

Figure 1:
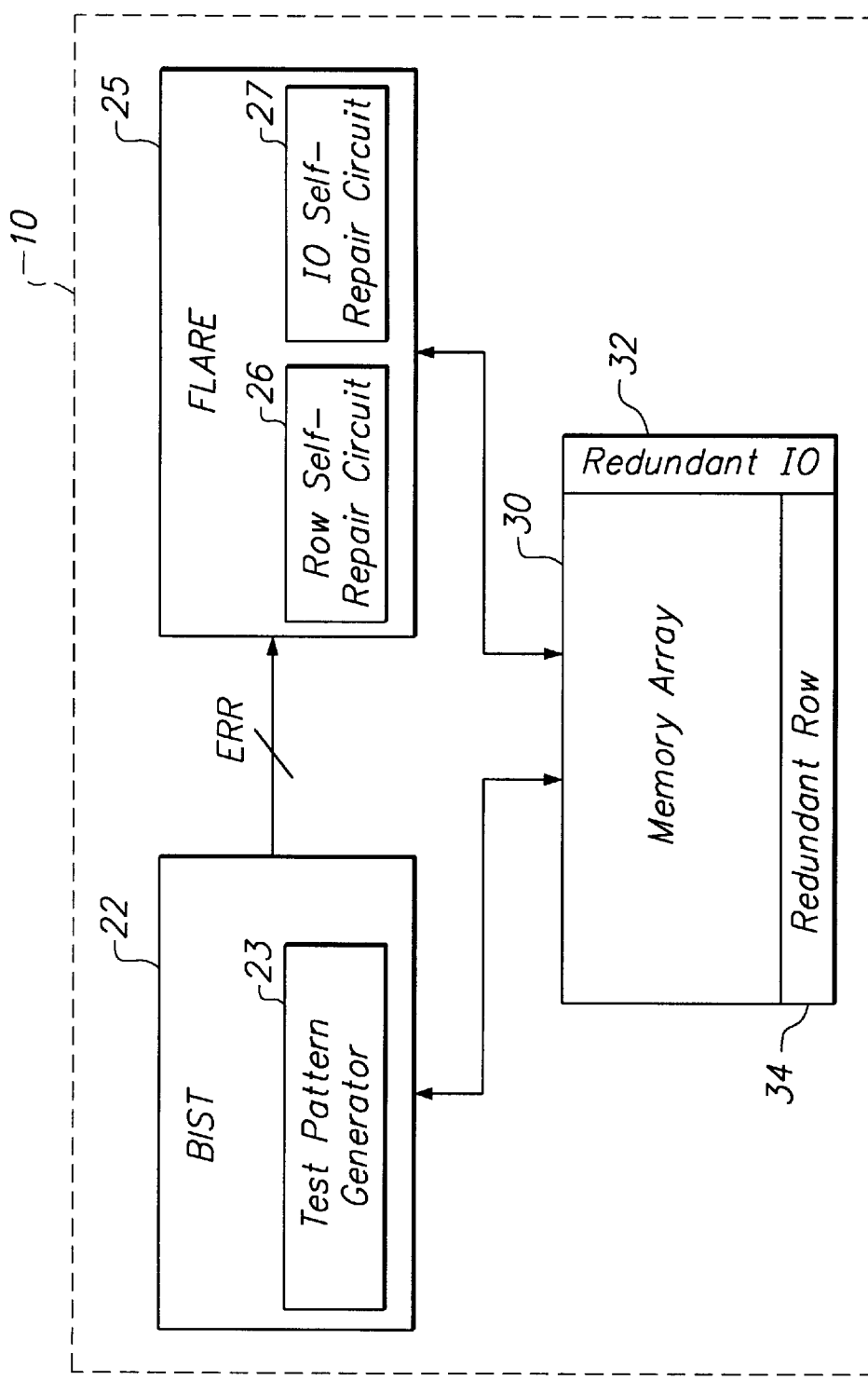
FIG. 1 is a block diagram of an ASIC memory system for repairing faulty memory lines according to the present invention.

Referring now to FIG. 1, there is shown a block diagram of a system 10 for testing and repairing configurable ASIC memories. System 10 comprises a memory array 30, a built-in self-test (BIST) circuit 22, and a fault-latching-and-repair-execution (FLARE) circuit 25. Memory array 30 contains a matrix of row memory lines intersecting I/O memory lines for storage logical data represented in binary format at the intersections of row memory lines and I/O memory lines. BIST 22 is coupled to memory array 30 to test for defective row and I/O memory lines, if any, in memory array 30. BIST 22 contains a test pattern generator 23 for generating different test patterns to verify the integrity of a memory cell. FLARE 25 is coupled to memory array 30 to repair defective row and I/O memory lines by redirecting the original address locations of defective memory lines to the mapped address locations of redundant or redundancy memory lines. FLARE 25 contains a row self-repair circuit 26 for repairing row memory lines and an I/O self-repair circuit 27 for repairing I/O memory lines. The decision to repair a faulty row or I/O memory line by FLARE circuit 25, as later described herein, depends on a dominant fault mechanism selected for implementing the repairing method.

Figure 2:
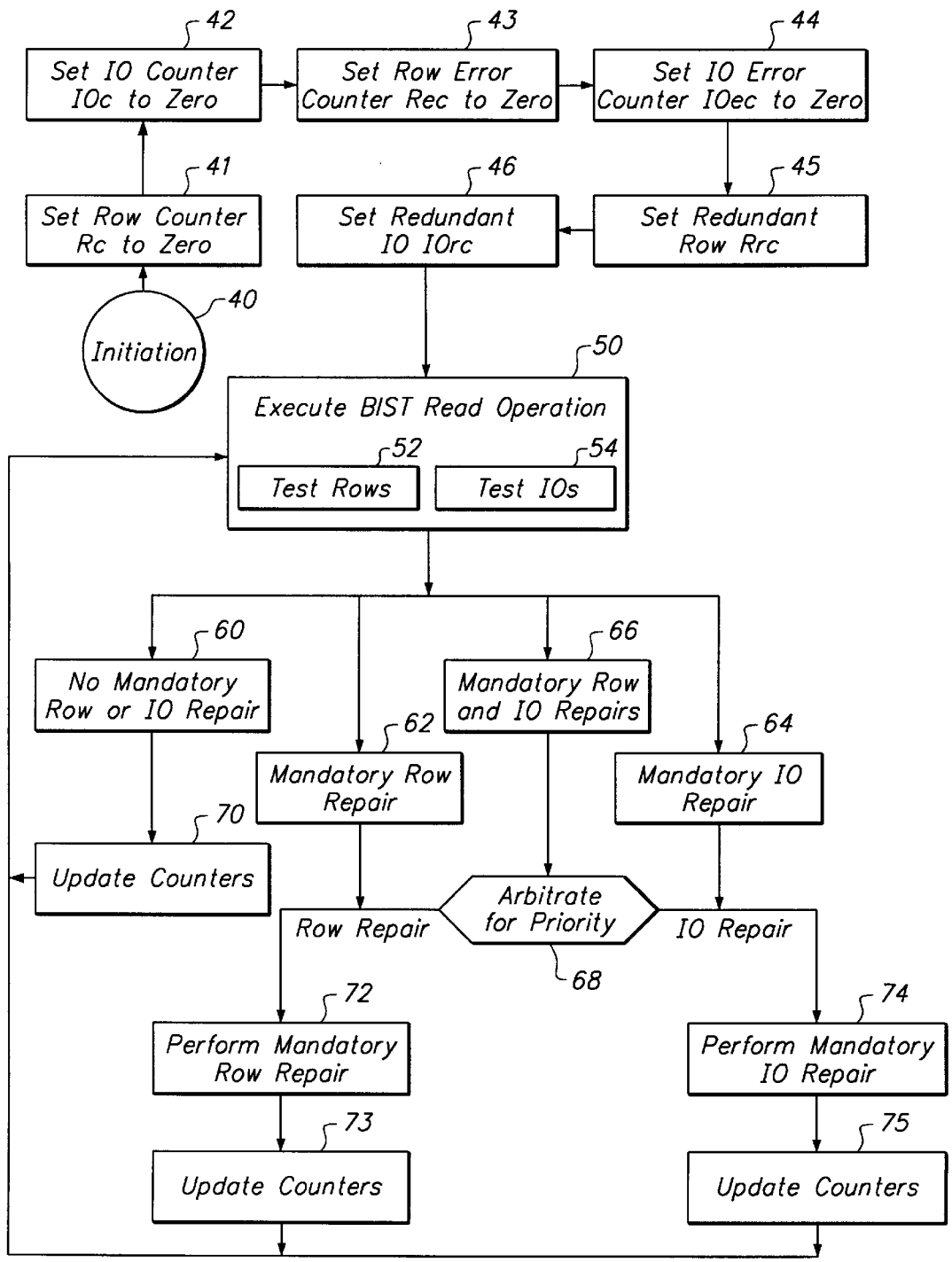
FIG. 2 is a flowgraph of the overall process of repairing an ASIC memory with redundancy row or I/O memory lines.

FIG. 2 shows a flowgraph of the preferred embodiment for performing repairs of defective row and I/O memory lines. The process starts with an initialization 40 to reset a plurality of counters to zero, including a rowcounter Rc41, an I/O counter I/Oc 42, a row error counter Rec 43, and an I/O error counter I/Oec 44. Rowcounter Rc41 and I/O counter I/Oc 42 indicate the row and I/O location of a particular memory cell in ASIC memory array 30 that is being testing. Row error counter Rec 43 maintains the total number of defective cells detected for a row memory line. I/O error counter I/Oec 44 maintains the total number of defective cells detected on an I/O memory line. Initialization 40 further comprises setting 45 a redundancy rowcounter Rrc representing the number of available redundancy rows, and setting 46 a redundancy I/O counter I/Orc representing the number of available redundancy I/O memory lines. Redundancy rowcounter Rrc 45 indicates the threshold for mandatory row repair occurrence during the testing and repairing process. Redundancy I/O counter I/Orc 46 indicates the threshold for mandatory row repair occurrence at a particular given time during the testing and repairing process. The threshold value of Rrc is initially set equal to the number of redundant row memory lines. In addition, the threshold value of I/Orc is initially set equal to the number of redundant I/O memory lines.

After the various counters have been appropriately set, a BIST read operation 50 is executed to read the stored data at a particular memory cell, as directed by Rc and I/Oc counters. A row test detects 52 any row defects on the internal structure of a memory cell while an I/O test detects 54 any I/O defects on the internal or peripheral structure of a memory cell. Row test 52 and I/O test 54 indicate one of four possible situations for a memory cell being tested, namely: no mandatory-row or I/O repair 60; a mandatory-row repair 62; a mandatory-I/O repair 64; or both mandatory-row and mandatory-I/O repairs 66. The first three situations create no conflicting procedures, but in a situation which requires both mandatory-row and mandatory-I/O repairs 66, the mandatory-row repair and the mandatory-I/O repair arbitrate 68 to determine which mandatory repair has the priority over the other. In the preferred embodiment, mandatory-row repair has been designated as the preferential mandatory repair scheme over the mandatory-I/O repair.

In all of these four possible situations, a set of counters must be updated following testing of a memory cell to reflect the occurrence of the BIST read operation. First, after a determination of no mandatory row or I/O repair 60, a specified set of counters is updated 70 to reflect that a BIST read operation has been executed, and no mandatory-row or mandatory-I/O repair 60 is necessary. Second, after a determination of mandatory-row repair 64, system 10 performs 72 mandatory-row repair to reroute the address location of the defective row memory line to a new address location of a redundant row memory line. A corresponding set of counters for the mandatory-row repair 62 is updated 73 to reflect that a BIST read operation has been executed. Third, after a determination of mandatory-I/O repair 64, system 10 performs 74 mandatory-I/O repair to reroute the address location of a defective I/O memory line to a new address location of a redundancy I/O memory line. A corresponding set of counters for the mandatory I/O repair 64 is updated 75 to reflect that a BIST read operation has been executed. The operations for these four repairing situations are further described with reference to FIGS. 7–9.

Figure 3:
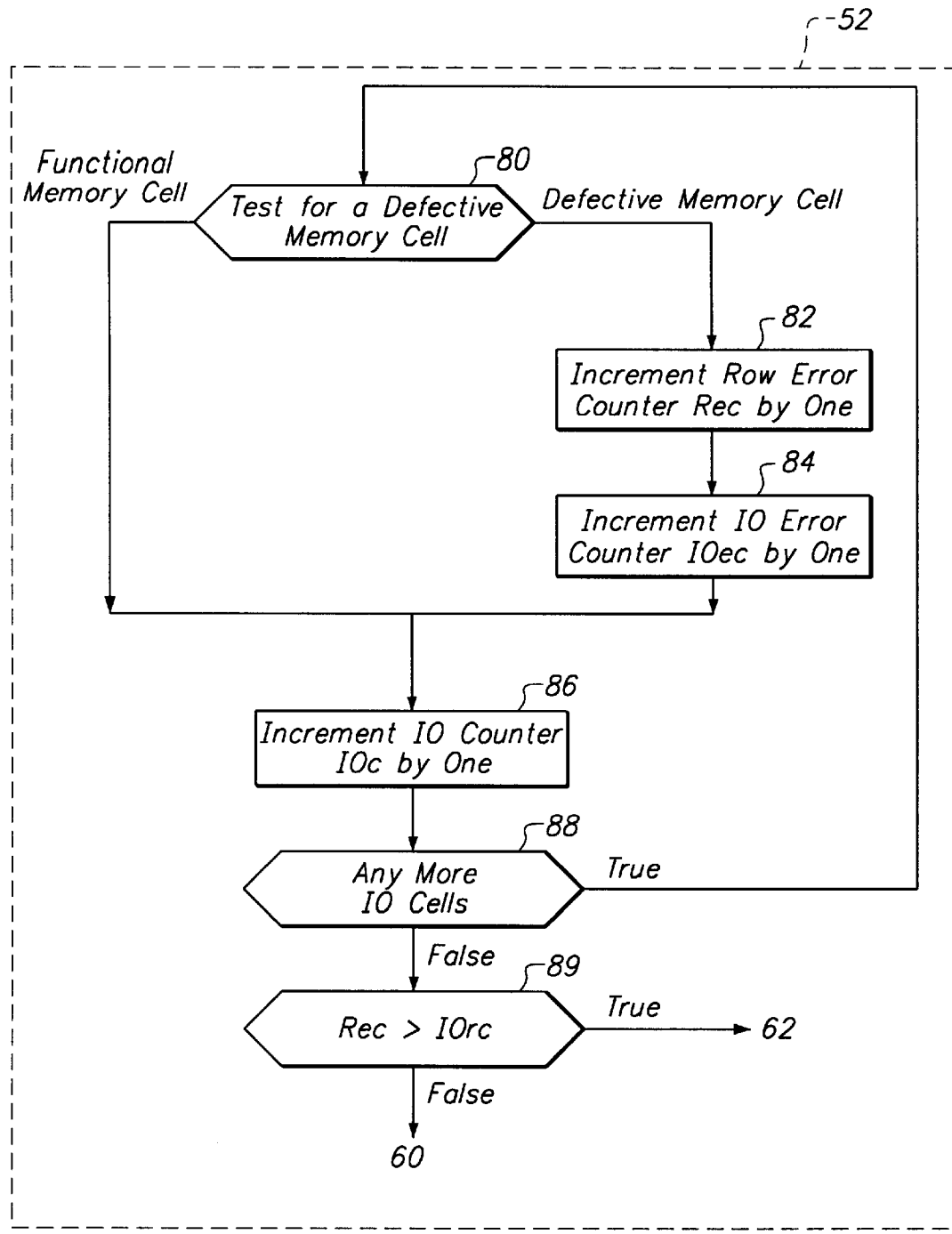
FIG. 3 is a flowgraph of the process of determining the mandatory-row repair.

Referring now to FIG. 3, there is shown a flowgraph of the process of testing 80 row memory cells to determine whether mandatory-row repair is required. As discussed above, rowcounter Rc 51 and I/O counter I/Oc 42 counters are initialized to zero, which accesses the memory cell at row zero and I/O zero location. If the memory cell is defective, row error counter Rec 43 increments 82 by one to maintain the correct count of the detected defective memory cells, and I/O error counter I/Oec 44 also increments 84 by one to track the correct count of the detected defective memory cells. Next, I/O counter I/Oc 42 increments 84 by one to move the pointer to the adjacent row memory cell. In addition, if the memory is not defective, the sequence proceeds to the common step 86. If there are more memory cells that have yet to be verified, then the process returns to the testing step 80 for verifying the integrity of the next memory cell. The sequence repeats until all I/O cells have been tested on a particular row. A mandatory row repair is necessary if Rec 43>I/Orc 46 counter and mandatory-row repair 62 is triggered. However, if Rec 43<I/Orc 46 counter, then no mandatory-row repair 60 is necessary.

Figure 4:
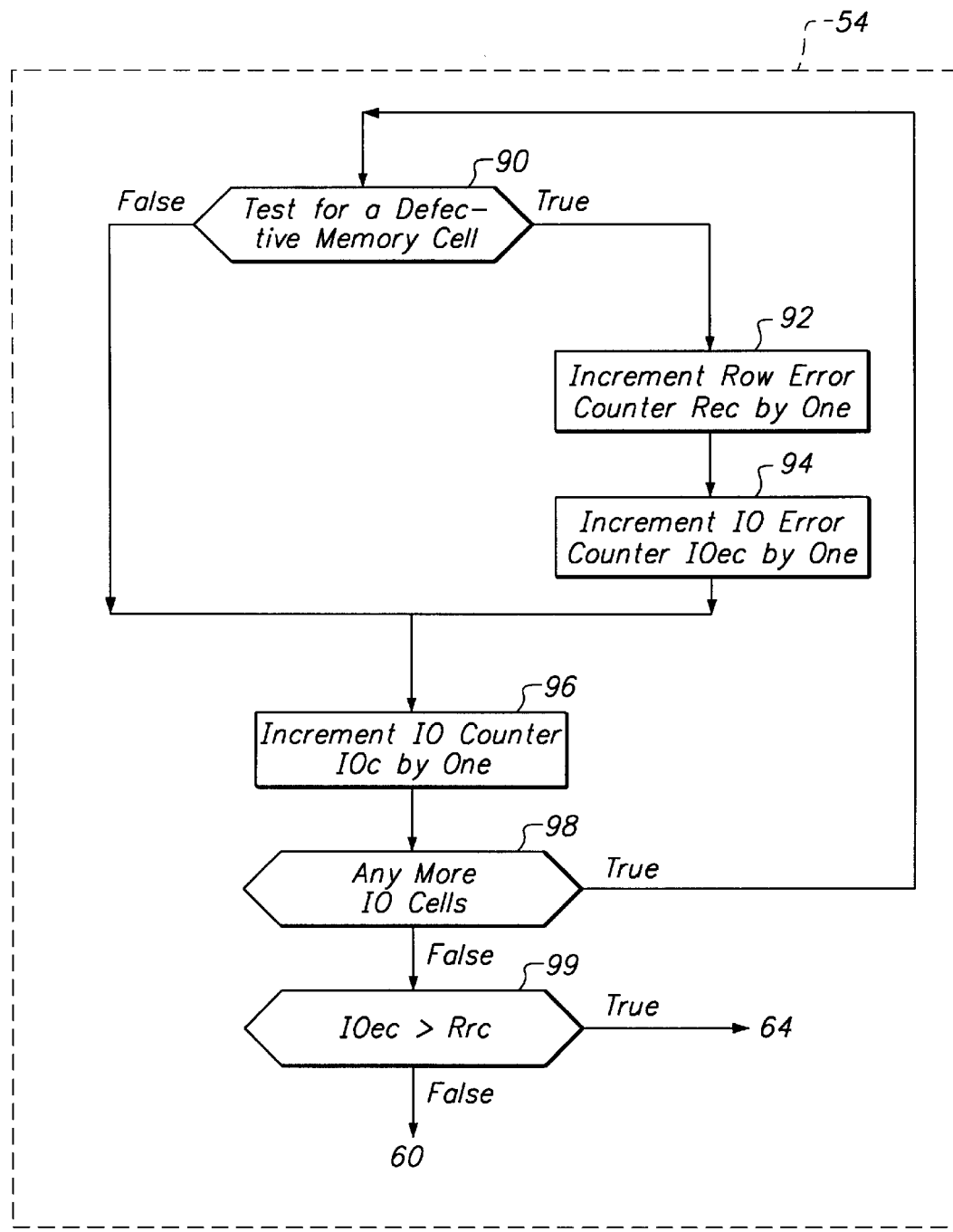
FIG. 4 is a flowgraph of the process of determining the mandatory-I/O repair.

FIG. 4 shows a flowgraph of the process of testing 41 I/O memory cells to determine whether mandatory-I/O repair is required. Similar to the testing 52 of row memory cells, if the memory cell is defective, row error counter Rec 43 increments 92 by one to maintain the correct count of detected defective memory cells, and I/O error counter I/Oec 44 also increments 94 by one to track the correct count of detected defective memory cells. If I/Oec 44>Rrc 45 counter, a mandatory-I/O repair is necessary and mandatory-I/O repair 64 is triggered. However, if I/Oec 44<Rrc 45 counter, then no mandatory-row repair 60 is necessary. Subsequently, I/O counter I/Oc 42 increments 96 by one to move the pointer to the adjacent row memory cell. In addition, if the memory is not defective, the sequence proceeds to the common step 96. If there are more memory cells that have yet to be verified, then the process returns to the testing step 90 for verifying the integrity of the memory cell. And again, the process repeats until all I/O cells have been tested on that particular row.

Figure 5:
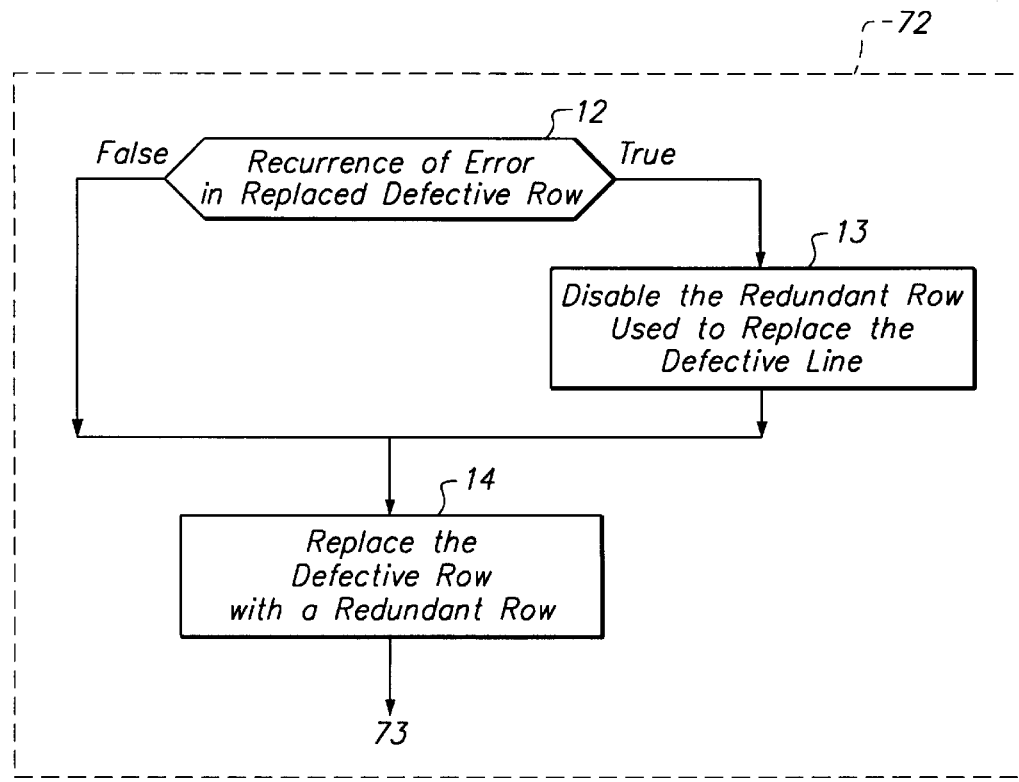
FIG. 5 is a flowgraph of the process of handling the recurrence error with the mandatory-row repair scheme.

Referring now to FIG. 5, there is shown a flowgraph of the process of executing recurrence errors of the mandatory-row repair scheme. The redundancy row and I/O memory lines are used as spare memory lines to replace defective row or I/O memory lines. In some instances, however, the redundancy row memory lines may themselves be defective, in which case system 10 yields a recurrence error 12 at the address location of the redundancy memory line. In such situations, the defective redundancy row memory line is disabled 13, and replaced 14 by another redundancy row memory line. In other instances where the redundancy row memory line is not defective, system 10 replaces the defective row memory line with a functional redundancy row memory line.

Figure 6:
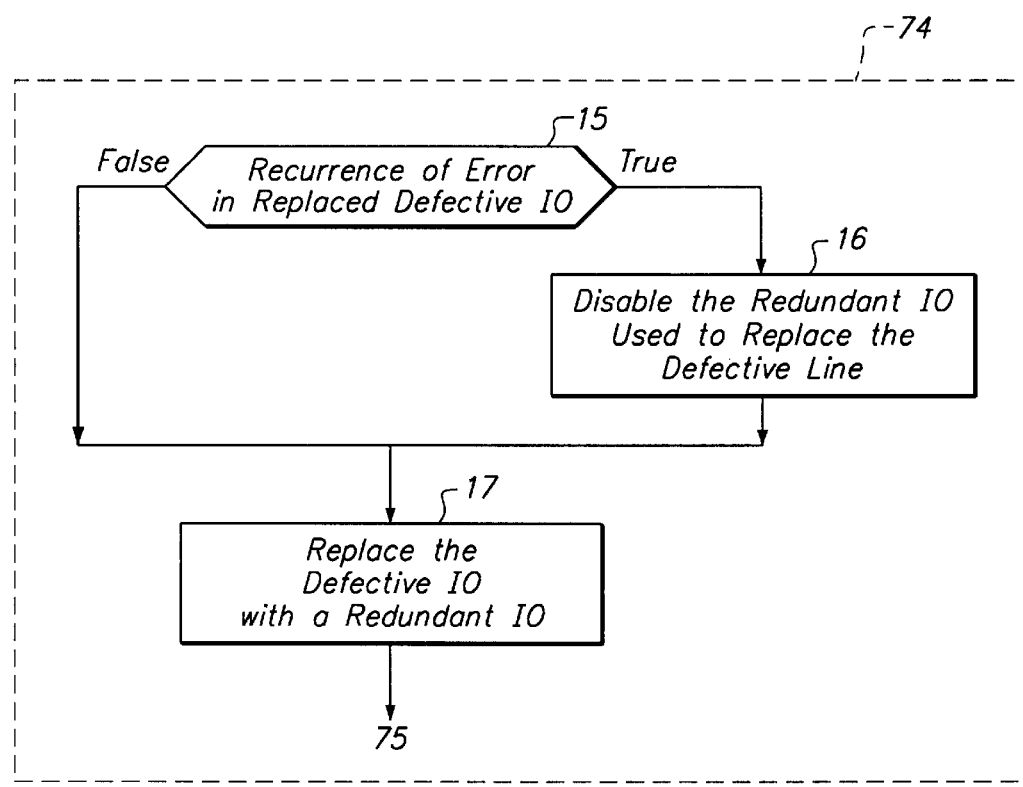
FIG. 6 is a flowgraph of the process of handling the recurrence error with the mandatory-I/O repair scheme.

In FIG. 6, there is shown a flowgraph of the process of handling recurrence errors in the mandatory-I/O repair scheme. As with redundancy row memory lines, the redundancy I/O memory lines may themselves be defective, in which case system 10 yields a recurrence error 15 at the address location of the redundancy I/O memory line. In such situations, the defective I/O memory line is disabled 16, and replaced 17 by another redundancy I/O memory line. In other instances where the redundancy I/O memory line is not defective, system 10 replaces the defective I/O memory line with a functional redundancy I/O memory line.

Figure 7:
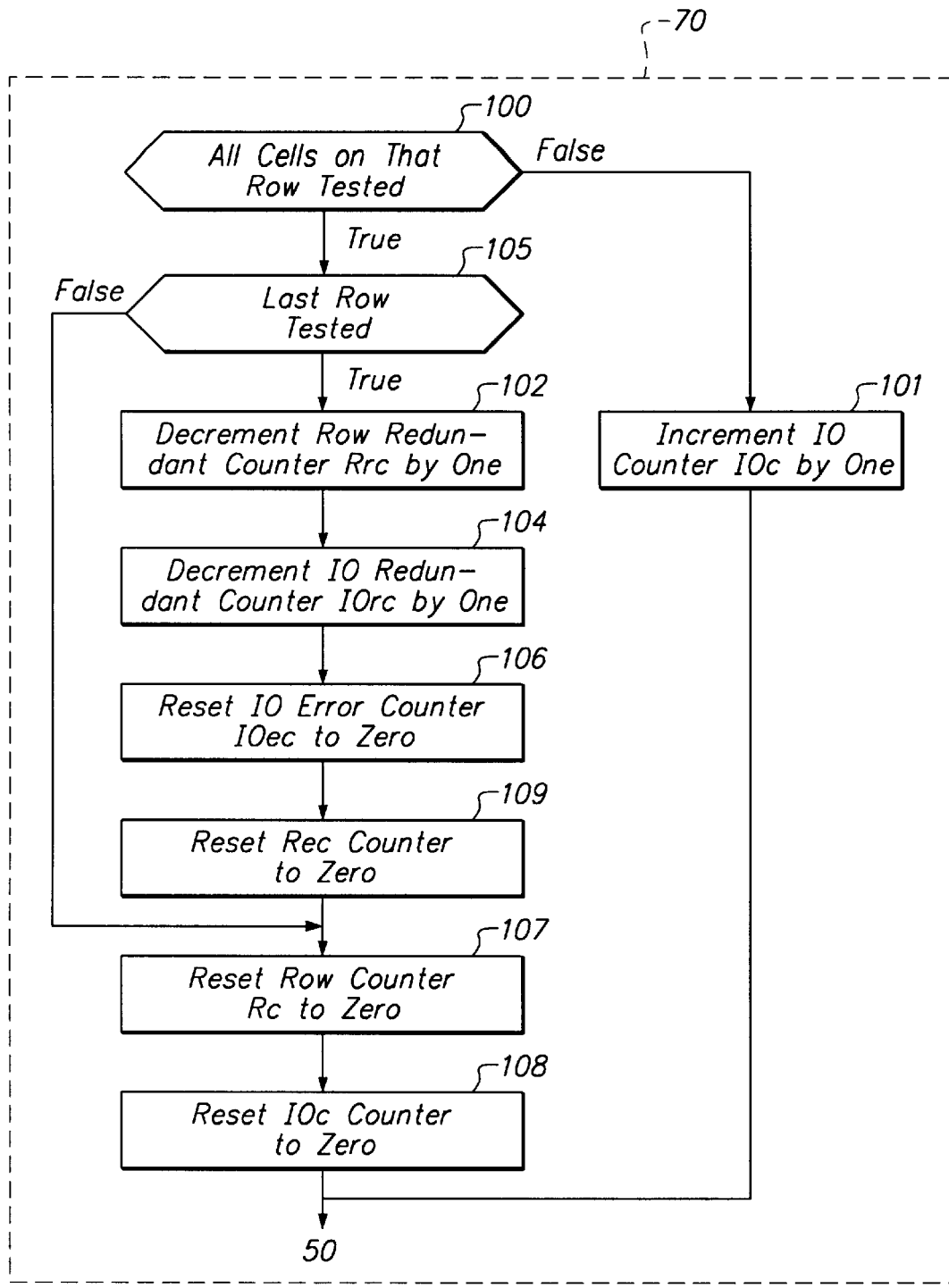
FIG. 7 is a flowgraph of the process of updating various counters after determining that no mandatory repair is necessary.

Referring now to FIG. 7, there is shown a flowgraph of the various counters that are updated 70 when no mandatory repair 60 is performed. If there remain memory cells on the same row memory line that have yet to be tested, then IOc counter increments 101 by one to move the pointer to the adjacent memory cell. I/O counter I/Oc 42 resets 108 to zero, and row error counter Rec 43 resets 109 to zero, at which point the process loops back to the BIST read operation 50. If all of the rows in memory array 30 have been tested 100, then the following steps are applicable. Rrc counter decrements 102 by one and I/O redundancy counter I/Orc 46 decrements 104 by one to reflect the progressive urgency scheme to increase the urgency to repair memory lines in memory array 30. Several counters are then reset to zero, including I/O error counter I/Oec 44 resets 116 to zero, rowcounter Rc 41 counter resets to zero, I/O counter I/Oc 42 sets 118 to zero, and row error counter Rec 43 counter resets 119 to zero.

FIG. 8 shows a flowgraph of the process of updating various counters following a mandatory-row repair of a defective row memory line with a redundancy row memory line. If all of the rows in the memory array 30 have been verified 110 and a mandatory-row repair 62 is indicated, then several counters are affected. Row redundancy counter Rrc 46 decrements 112 by one to indicate a row redundancy memory line has been assigned to replace the defective memory line. Row error counter Rec 44 is reset 116 to zero and row counter Rc 41 is reset 117 to zero. Conversely, if there remain other rows to be tested, rowcounter Rc 41 increments 111 by one. The next three steps are part of the mandatory-row repair, either at the end of a row memory line or at the end of a BIST pass. Row redundancy counter Rrc 45 decrements 114 by one, I/O counter I/Oc 42 resets 118 to zero, and row error counter Rec 43 resets 119 to zero.

FIG. 9 shows the process of updating various counters following a mandatory-I/O repair in which a defective I/O memory line is replaced by a redundancy I/O memory line. If all of the rows in the memory array have verified 120 and a mandatory-I/O repair 64 is necessary, then several counters are updated. Row redundancy counter Rrc 45 decrements 122 by one to reflect assignment of a redundancy memory line to replace the defective memory line. I/O error counter I/Oec 44 is reset 126 to zero and rowcounter Rc 41 is reset 127 to zero. Conversely, if there remain other rows to be tested, row error counter Rc 41 increments 121 by one. The following sequences are part of the mandatory-I/O repair, either at the end of a row memory line or at the end of a BIST pass. I/O redundancy counter I/Orc 46 decrements 124 by one, and I/O counter I/Oc 42 resets 128 to zero, and row error counter Rec 43 also resets 129 to zero.

We claim:

1. A method for performing on-chip diagnosis and repairing of a configurable ASIC memory array, having a plurality of memory row lines intersecting a plurality of memory I/O lines, with a built-in self test circuit and with redundant memory row and I/O lines, the method comprising:

testing with the built-in self test circuit the memory cells at the intersections of memory row lines and memory I/O lines to determine the number of defective cells in each memory row or I/O line;

determining that a repair of the ASIC memory array is mandatory for a number of defective memory cells along any memory row line exceeding a first threshold;

determining that a repair of the ASIC memory array is mandatory for a number of defective memory cells along any memory I/O line exceeding a second threshold;

repairing the ASIC memory array by selectively repairing a single memory row line in response to the determination that the number of defective cells along the memory row line exceeds the first threshold; and repairing the ASIC memory array by selectively repairing a single memory I/O line in response to the determination that the number of defective cells along the memory I/O line exceeds the second threshold.

2. The method of claim 1 wherein the step of selectively repairing a single memory row line comprises repairing the memory row line by rerouting the address of the defective memory row line to the address of a first available redundant memory row line.

3. The method of claim 2, further comprising:

testing with the built-in self test circuit for recurrence error in the first available redundant memory row line used to replace the defective memory row line; and rerouting the address of the first available redundant memory row line to a second available redundant memory row line in response to determination that the first available redundant memory row line includes at least one defective cell.

4. The method of claim 1 wherein the step of selectively repairing a single memory I/O line comprises repairing the memory I/O line by rerouting the address of the defective memory I/O line to the address of a first available redundant memory I/O line.

5. The method of claim 4, further comprising:

testing with the built-in self test circuit for recurrence error in the first available redundant memory I/O line used to replace the defective memory I/O line; and rerouting the address of the first available redundant memory I/O line to a second available redundant memory I/O line in response to determination that the first available redundant memory I/O line includes at least one defective cell.

6. The method of claim 1, wherein the step of selectively repairing further comprises:

arbitrating whether to selectively repair either the memory row line or the memory I/O line in response to determination that the number of defective cells in the memory row line exceeds the first threshold and the number of cells in the memory I/O line exceeds the second threshold.

7. The method of claim 6, wherein the memory row line is repaired in response to determination that the number of defective cells in the memory row line exceeds the first threshold and the number of cells in the memory I/O line exceeds the second threshold.

8. The method of claim 6, wherein the memory I/O line is repaired in response to determination that the number of defective cells in the memory row line exceeds the first threshold and the number of cells in the memory I/O line exceeds the second threshold.

* * * * *